United States Patent [19]

Satoh

[11] Patent Number: 4,972,412

[45] Date of Patent: Nov. 20, 1990

[54] DELAY TIME CHECKING ARRANGEMENT

[75] Inventor: Tatsuo Satoh, Tokyo, Japan

[73] Assignee: NEC Corporation, Tokyo, Japan

[21] Appl. No.: 283,231

[22] Filed: Dec. 12, 1988

[30] Foreign Application Priority Data

Dec. 21, 1987 [JP]  Japan ................. 63-321545

[51] Int. Cl.⁵ ............................. G01R 31/28
[52] U.S. Cl. ..................... 371/22.1; 371/62
[58] Field of Search ............... 371/22.1, 62; 324/73 R

[56] References Cited

U.S. PATENT DOCUMENTS

| | | | |
|---|---|---|---|
| 4,058,767 | 11/1977 | Muehldorf et al. | 324/73 R |
| 4,063,080 | 12/1977 | Eichelbarger et al. | 371/62 |
| 4,146,835 | 3/1979 | Chnapko et al. | 371/22.1 |
| 4,425,643 | 1/1984 | Chapman et al. | 371/22.1 |
| 4,736,351 | 4/1988 | Oliver | 371/22.1 |
| 4,876,501 | 10/1989 | Ardini et al. | 324/73 R |

Primary Examiner—Charles E. Atkinson
Attorney, Agent, or Firm—Helfgott & Karas

[57] ABSTRACT

A circuit arrangement for checking excessive time delay in the propagation of signals between two circuit blocks is provided in which two successive square wave clock signals are generated, each having a cycle period equal to the maximum permissible time delay, and a test signal is propagated between the circuit blocks initiated together with the first clock signal. The times of receipt by the second circuit block of the test signal and each clock signal are stored, and means are provided for producing a disparity signal whenever there is a disparity between the two stored signals. A third clock signal is generated which lags the second clock signal and this is compared with the disparity signal to produce an excess delay indicating signal whenever they simultaneously occur.

4 Claims, 3 Drawing Sheets

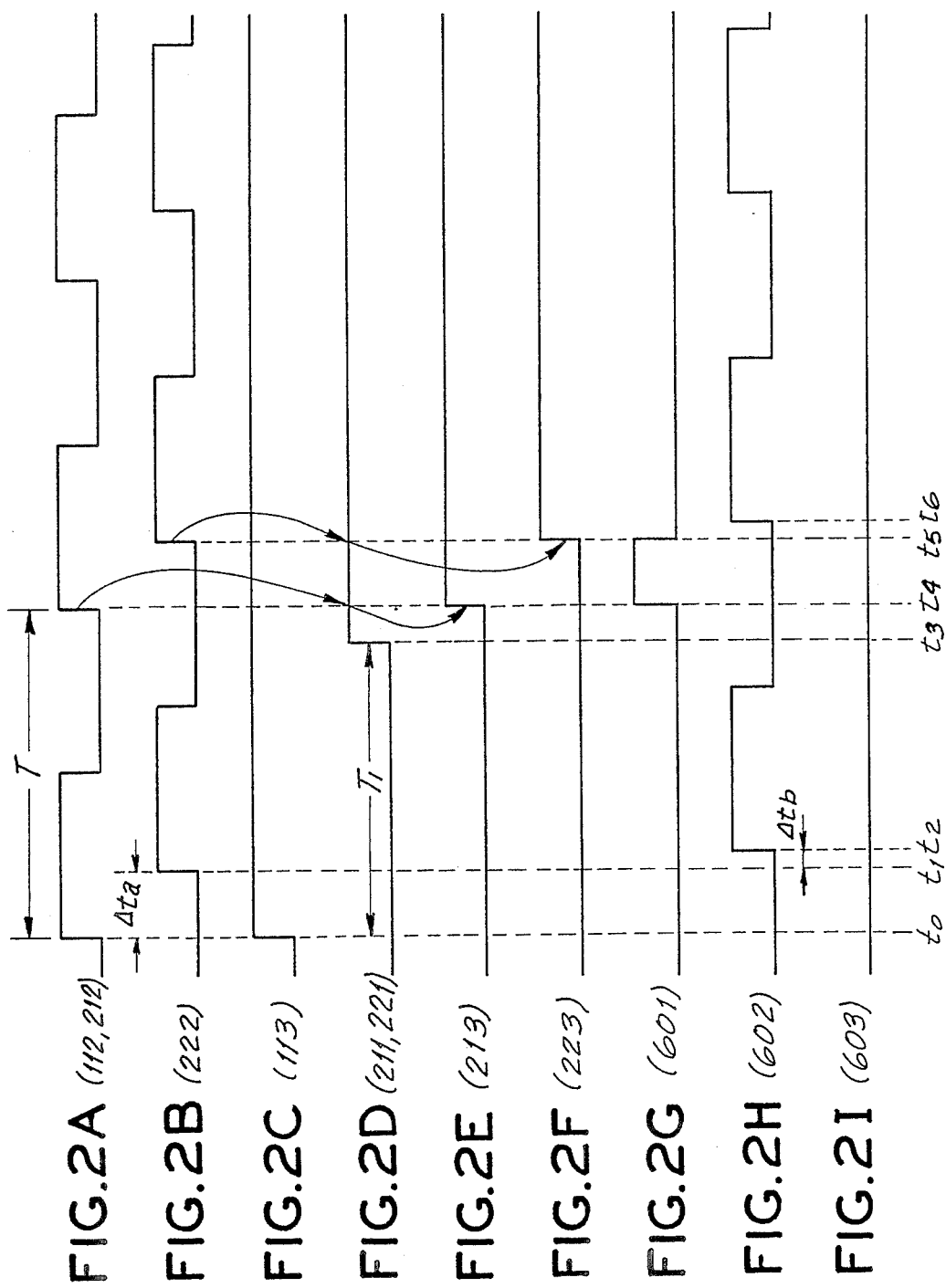

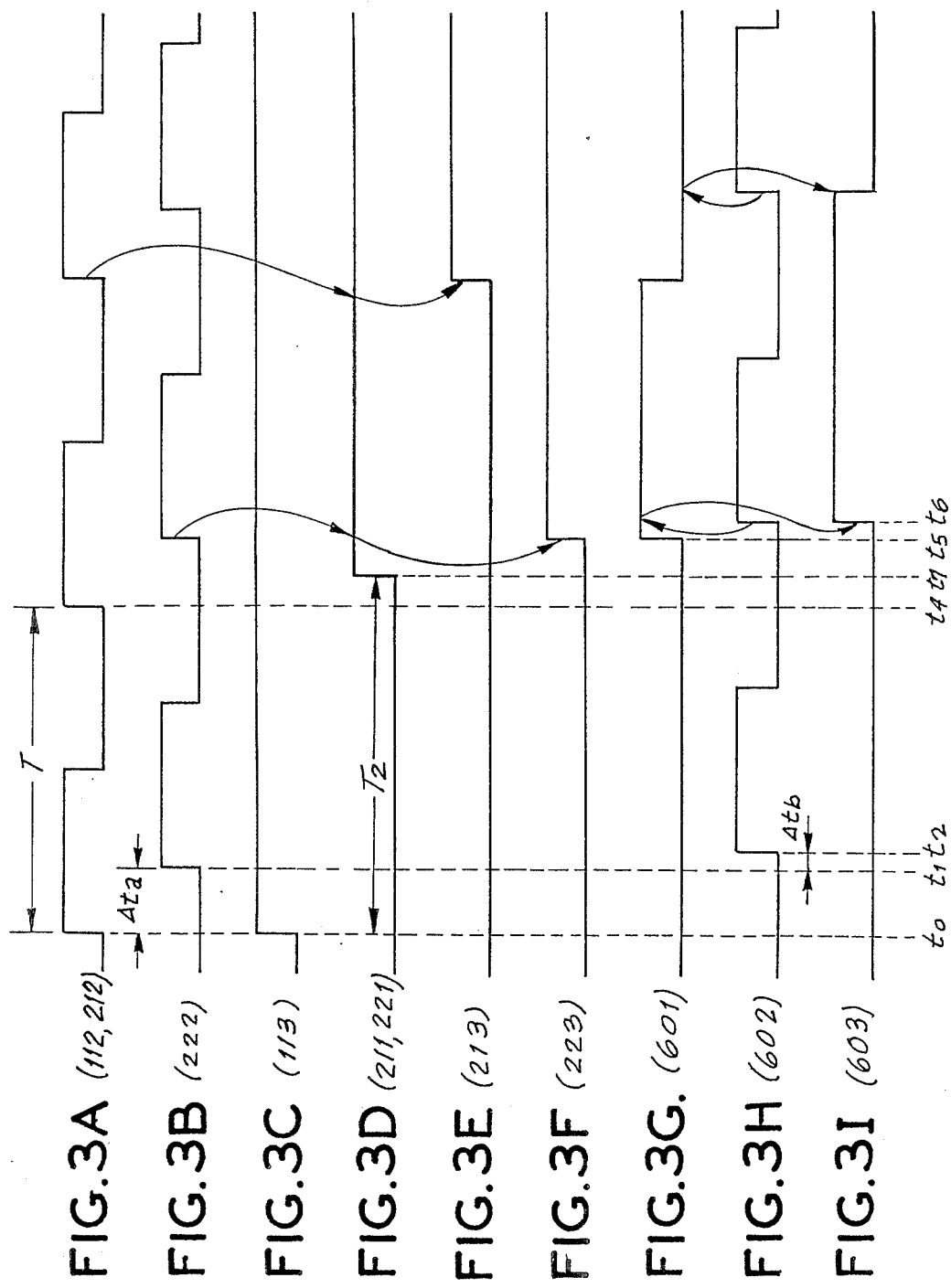

DELAY TIME CHECKING ARRANGEMENT

BACKGROUND OF THE INVENTION

The present invention relates to electrical timing systems, and more particularly to a delay time checking circuit arrangement.

No means has heretofore been put into practical use or proposed to check whether or not the signal propagation delay time from a point (for instance, a flip-flop (F/F)) in an integrated circuit (IC) chip to another point (for instance, a F/F) in another IC chip is shorter or longer than a predeterminedly allowed time when the IC chips lie on a package substrate or on two respective package substrates.

A logic circuit in a logic circuit package for use in a data processing unit is usually designed to satisfy the condition that the clock cycle of a clock signal $t_c$ fed to the circuit should be greater than an allowed time $td_{MAX}$ in which a signal must propagate between two F/Fs present in the circuit. Therefore, if the actual signal-propagation (ASP) delay time between the F/Fs in the logic circuit of an actually manufactured data processing unit exceeds the allowed time $td_{MAX}$, the unit may operate erroneously. In such a case, this logic circuit is checked. However, for lack of any means to directly detect the ASP delay time between two F/Fs, it takes a long time to locate the operating elements which are causing the trouble.

SUMMARY OF THE INVENTION

Accordingly, it is an object of the present invention, to provide a delay time checking arrangement for checking the delay time in a signal propagated between first and second circuit blocks to be checked. This time delay checking arrangement comprises clock generator means for generating a first clock signal and a second clock signal lagging behind the first clock signal said first and second clock signals having a cycle period equal to a predetermined maximum delay time, transfer means for propagating a test signal, supplied from the first circuit block in synchronism with the first clock signal, to the second circuit block; first memory means contained in said second circuit block to store the test signal in synchronism with the first clock signal; second memory means contained in the second circuit block to store the test signal in synchronism with the second clock signal; and detector means for continuing to produce a disparity signal as long as disparity is detected between the output signal of the first memory means and that of the second memory means beyond a time period of the second clock signal. An excess time delay indication is also provided by generating a third clock signal, and by comparing this third clock signal with the disparity signal to produce an output excess time delay indicating signal whenever they occur simultaneously.

BRIEF DESCRIPTION OF THE DRAWINGS

Other features and advantages of the present invention will become apparent from the following detailed description when taken in conjunction with the accompanying drawings in which:

FIGS. 2A to 2I show waveforms at different point of FIG. 1 when an ASP delay time does not exceed a predeterminedly allowed time; and FIGS. 3A to 3I show waveforms at different points of FIG. 1 when an ASP delay time does exceed a predeterminedly allowed time.

In the drawings, the same reference numerals represent the same structural elements.

DETAILED DESCRIPTION OF THE PREFERRED EMBODIMENT

Figure 1:
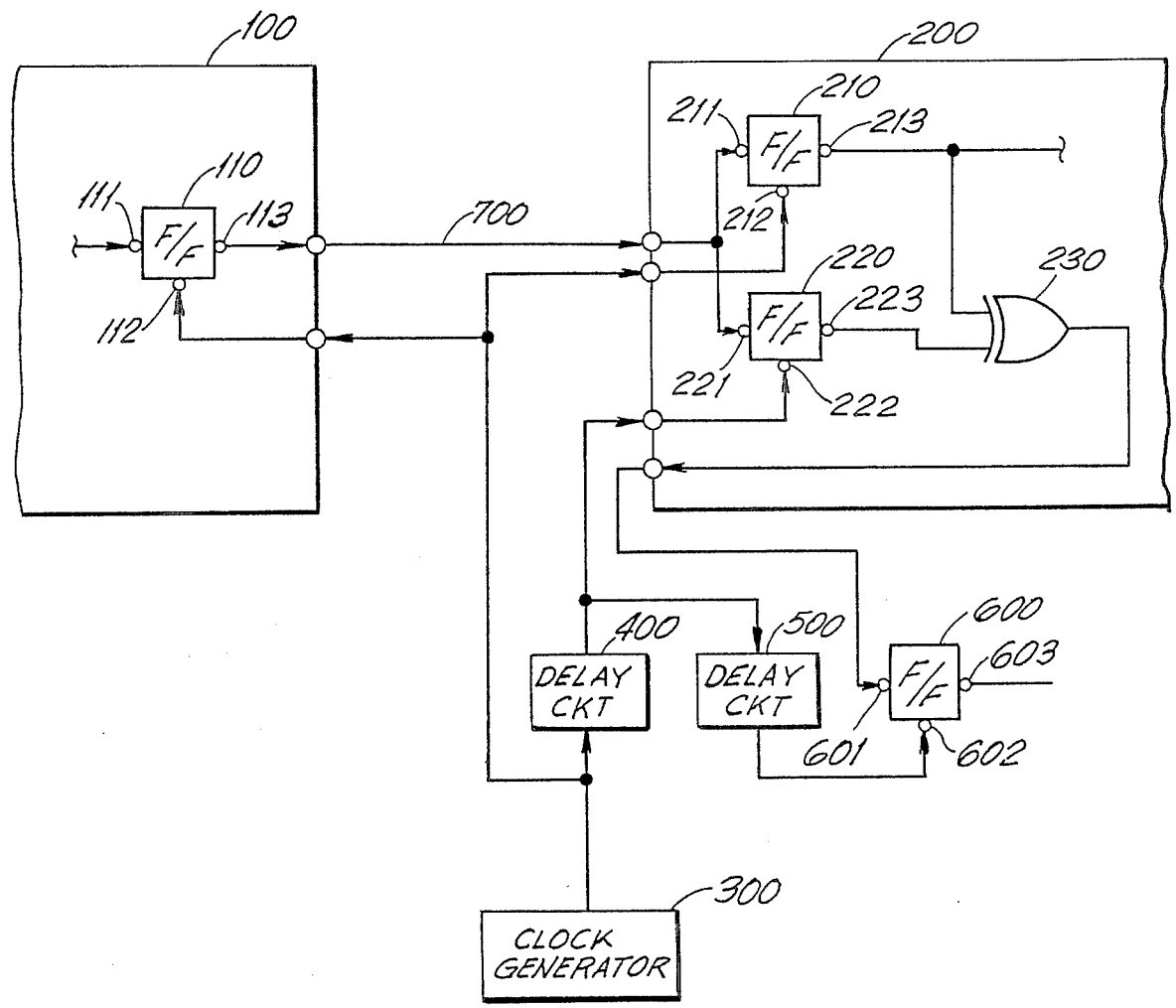
FIG. 1 is a block diagram of an embodiment of the invention.

Referring to FIG. 1, a preferred embodiment of the invention comprises a first circuit block 100; a second circuit block 200; a clock signal generator 300; a delay circuit 400; another delay circuit 500; a flip-flop circuit 600 having a signal input terminal 601, a clock input terminal 602, and a signal output terminal 603; and a signal line 700. The block 100 includes a F/F 110 having a signal input terminal 111, a clock input terminal 112 and a signal output terminal 113, and other circuit elements (not shown). The block 200 includes a F/F 210 having a signal input terminal 211, a clock input terminal 212 and a signal output terminal 213; a F/F 220 having a signal input terminal 221, a clock input terminal 222 and a signal output terminal 223; an exclusive OR circuit 230 for performing the Exclusive OR operation of an output signal from the terminal 213 and an output signal from the terminal 223; and other circuit elements (not shown). The blocks 100 and 200 are, for example, IC chips. The generator 300 generates a first clock signal having a clock period of time T, which is distributed to the terminals 112 and 212 and the circuit 400. The circuit 400 receives the first clock signal to distribute a second clock signal lagging behind the first clock signal by a period of time $\Delta t_a$, to the terminal 222 and the circuit 500. The circuit 500 receives the second clock signal to distribute a third clock signal, lying behind the second clock signal by a period of time $\Delta t_b$, to the input terminal 602. Each F/F stores an input signal given to its signal input terminal at the leading edge of the clock signal fed to its clock input terminal, and supplies the input signal to its output terminal.

Next will be described the checking operation by the embodiment. In the embodiment, it is supposed to be so designed that the signal propagation delay time that a signal takes to propagate from the F/F 110 to the F/F 210 may not exceed a predeterminedly allowed time, for instance, one clock period T.

Referring to FIGS. 1 and 2A to 2I, description will be made on a case in which the delay time does not exceed the predeterminedly allowed time T. In advance of checking, a logical "1" signal (hereafter abbreviated as "1" signal) is supplied to the terminal 111 of the F/F 110 before a time point $t_0$. When the first clock signal (FIG. 2A) fed to the terminals 112 and 212 rises up at the time point $t_0$, the F/F 110 stores the logical "1" signal supplied to the terminal 111 to produce it from the terminal 113 (FIG. 2C). Meanwhile, since a logical "0" signal (hereinafter abbreviated as "0" signal) already exists at the terminal 211 at this moment (FIG. 2D), the F/F 210 stores this signal to produce it from the terminal 213 (FIG. 2E). Because the second clock signal fed to the terminal 222 rises up (FIG. 2B) at a time point $t_1$, which is later than the point $t_0$ by the period $\Delta t_a$, the F/F 220 stores the "0" signal supplied to the terminal 221 to produce it from the terminal 223 (FIG. 2F). Further, since the third clock signal fed to the terminal 602 rises up (FIG. 2H) at a time point $t_2$, which is later than the point $t_1$ by another period of time $\Delta t_b$, the F/F 600 stores a signal supplied to the terminal 601 (FIG. 2G) to produce it from the terminal 603 (FIG. 2I). Specifically, at this time, with the "0" signal supplied from the terminals 213 and 223, the circuit 230 produces a "0" signal to the terminal 601 and, as a result, the F/F 600 produces a "0" signal from the terminal 603. The "1" signal at the terminal 113 reaches the terminals 211 and 221 at a time point $t_3$, which lies behind the point $t_0$ by a period of time $T_1$ shorter than the period T. When the first clock signal again rises up at a time point $t_4$, T later than the point $t_0$, the F/F 210 stores the "1" signal to produce it from the terminal 213 (FIG. 2E) because this "1" signal has already reached the terminal 211. At this time, the terminals 213 and 223 produce "1" and "0" signals, respectively, and the logical levels of the two terminals are therefore unequal, so that the circuit 230 produces a "1" signal (FIG. 2G). The second clock signal rises up at a time point $t_5$, later than the point $t_4$ by the period $\Delta t_a$, and the F/F 220 supplies this "1" signal from the terminal 223 (FIG. 2F) since the "1" signal from the terminal 113 exists at the terminal 221. As a result, both the terminals 213 and 223 produce "1" signals, so that the circuit 230 produces a "0" signal. Though the third clock signal again rises up at a time point $t_6$, $\Delta t_b$ later than the point $t_5$, the F/F 600 continues to supply a "0" signal from the terminal 603 because a "0" signal already exists at the terminal 602 at this time.

In this manner, if the ASP delay time $T_1$ between the F/F's 110 and 210 is shorter than the predeterminedly allowed time T, the terminal 603 of the F/F 600 will continue to produce the "0" signal.

Referring to FIGS. 1 and 3A to 3I, description will next be made on a case in which the ASP delay time $T_2$ between the F/F's 110 and 210 does exceed the predeterminedly allowed time T.

Upon rise of the first clock signal fed to the input terminals 112 and 212 as indicated at the point $t_0$ of FIG. 3A, the F/F 110 stores a "1" signal supplied to the terminal 111 in advance to produce it from the terminal 113 (FIG. 3C). Meanwhile, since a "0" signal already exists at the terminal 211 at this moment (FIG. 3D), the F/F 210 stores this signal to produce it from the terminal 213 (FIG. 3E).

With the rise of the second clock signal fed to the terminal 222 as indicated at the point $t_1$, the F/F 220 stores the "0" signal supplied to the terminal 221 to produce it from the terminal 223 (FIG. 3F). Further, when the third clock signal fed to the terminal 602 rises up (FIG. 3H) at the point $t_2$, the F/F 600 stores a signal supplied to the terminal 601 (FIG. 3G) to produce it from the terminal 603 (FIG. 3I). Specifically, at this time, with the "0" signal supplied from the terminals 213 and 223, the circuit 230 produces a "0" signal to the terminal 601 and, as a result, the F/F 600 produces a "0" signal from the terminal 603. When the first clock signal again rises up at the point $t_4$, the F/F 210 continues to hold the "0" signal because the "1" signal at the terminal 113 has yet to reach the terminal 211. The "1" signal at the terminal 113 reach the terminals 211 and 221 at a time point $t_7$, which is later than the point $t_0$ by a period of time $T_2$ longer than the period T (FIG. 3D). When the second clock signal again rises up at the point $t_5$, the F/F 220 stores this "1" signal to produce it from the terminal 223 (FIG. 3F) because the "1" signal has already reached the terminal 221. At this time, the terminals 213 and 223 produce the "0" and "1" signals, respectively, and the logical levels of the two terminals are therefore unequal, so that the circuit 230 produces a "1" signal (FIG. 3G). When the third clock signal rises at the point $t_6$, the F/F 600 stores the "1" signal at the terminal 601 to produce it from the terminal 603 (FIG. 3I).

Thus, by monitoring the logical level at the output terminal 603 of the F/F 600 in this manner, the delay time can be checked.

While this invention has so far been described with reference to the preferred embodiment thereof, it will now readily be possible by those skilled in the art to put this invention into practice in various other manners.

What is claimed is:

1. A delay time check circuit arrangement for determining excess time between first and second circuit blocks to be checked, comprising:

first clock generator means for generating a first square wave clock signal and a second square wave clock signal lagging behind said first clock signal;

said first and second clock signals having a cycle time period equal to a predetermined maximum time delay;

transfer means for propagating a test signal, supplied from said first block in synchronism with said first clock signal, to said second circuit block;

first memory means contained in said second circuit block and connected to said first block generator means and storing said test signal in synchronism with said first clock signal supplied from said first clock generator means;

second memory means contained in said second circuit block and connected to said first clock generator means and storing said test signal in synchronism with said second clock signal supplied from said first clock generator means; and detector means for continuing to produce a disparity signal as long as disparity is detected between an output signal of said first memory means and an output signal of said second memory means beyond a time period of said second clock signal.

2. A delay time check circuit arrangement as claimed in claim 1 further comprising:

second clock generator means for generating a third clock signal lagging behind said second clock signal; and third memory means connected to said second clock generator means and storing said disparity signal in synchronism with said third clock signal.

3. A circuit arrangement for checking the time delay in the propagation of a signal between a first circuit block to a second circuit block comprising:

means for generating a first square wave clock signal and a second square wave clock signal lagging behind said first clock signal, said clock signals having a cycle period equal to a desired maximum time delay, means for generating a test signal at said first circuit block in synchronism with the initiation of said first clock signal and for propagating said test signal to said second circuit block, a first flip-flop in said second circuit block connected to provide a stored output signal upon receipt of said test signal in synchronism with said first clock signal, a second flip-flop in said second circuit block connected to provide a stored output signal upon receipt of said test signal in synchronism with said second clock signal;

an exclusive "or" circuit connected the stored output signals from said first and second flip-flops and providing an output signal only when there is a disparity between said received flip-flop signals, and means for producing an excess time delay indicating signal in response to the simultaneous occurrence of said disparity signal and a delayed signal derived from said second clock signal.

4. The delay time checking circuit arrangement of claim 3 wherein said means for producing an excess time delay indicating signal comprises a time delay circuit connected to receive and delay said second clock signal, and a third flip-flop connected to produce said excess time delay indicating signal in response to the receipt of said disparity signal and said delayed second clock signal.

* * * * *